(12) United States Patent
Vashchenko et al.

(10) Patent No.: US 7,521,310 B1
(45) Date of Patent: Apr. 21, 2009

(54) VERTICAL THYRISTOR IN COMPLEMENTARY SIGE BIPOLAR PROCESS

(75) Inventors: Vladislav Vashchenko, Palo Alto, CA (US); Alexel Sadovnikov, Sunnyvale, CA (US); Peter J. Hopper, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 431 days.

(21) Appl. No.: 11/261,235

(22) Filed: Oct. 29, 2005

(51) Int. Cl.
*H01L 21/8238* (2006.01)
(52) U.S. Cl. .................. 438/203; 438/336; 257/525; 257/E27.041; 257/E27.063

(58) Field of Classification Search .............. 438/202, 438/234, 235, 309, 313, 322, FOR. 165, 336; 257/517, 525, 555, E27.063, E27.041, E27.055, 257/E27.057
See application file for complete search history.

(56) References Cited

U.S. PATENT DOCUMENTS 5,844,258 A * 12/1998 Oh .............................. 257/139

FOREIGN PATENT DOCUMENTS

JP           2001332717 A  * 11/2001

* cited by examiner

*Primary Examiner*—Brook Kebede
(74) *Attorney, Agent, or Firm*—Volrath & Associates

(57) ABSTRACT

In a complementary SiGe bipolar process, a pnpn thyristor structure is formed from some of the layers of a pnp transistor and an npn transistor formed on top of each other and making use of the SiGe gates to define the blocking junction.

18 Claims, 3 Drawing Sheets

VERTICAL THYRISTOR IN COMPLEMENTARY SIGE BIPOLAR PROCESS

FIELD OF THE INVENTION

The invention relates to thyristors and in particular to ESD devices formed in a complementary bipolar process.

BACKGROUND OF THE INVENTION

In complementary bipolar process the process specifics do not allow conventional lateral ESD protection devices to be formed.

Furthermore, difficulties are faced by bipolar junction devices as electrostatic discharge (ESD) protection structures, since in the case of high performance radio frequency bipolar junction transistors (RF BJTs) the subcollector is typically heavily doped which results in a high holding voltage and low on-state resistance due to the high density of injected carriers required after snapback. Such a prior art vertical BJT is shown in cross section in FIG. 1, which shows an n-polysilicon emitter 100 formed on a p-base 102 and an n-epitaxially grown collector 104 with subcollector in the form of an n-buried layer (NBL) 106 contacted through an n-sinker 108.

SCRs as ESD protection structures also face difficulties in a bipolar process since in a vertical bipolar process the collector of an npn BJT is typically implemented using a subcollector comprising an n-buried layer. This n-buried layer poses difficulties for SCR devices since it creates a high level of isolation of the p-emitter of the SCR. One prior art solution has been to partially block the subcollector. This is shown in FIG. 2, which shows a cross-section through an SCR. The SCR includes the npn structure of a vertical bipolar transistor comprising emitter 200, p-base 202, and collector 204 with subcollector in the form of NBL 206 contacted through n-sinker 208. In addition it includes a p-emitter 210 in the form of a sinker to define an npnp structure. As is shown in FIG. 2, the collector is partially blocked by a shallow trench isolation (STI) region 212.

The present invention seeks to provide an alternative ESD protection structure in the case of a complementary silicon-germanium (SiGe) bipolar process.

SUMMARY OF THE INVENTION

According to the invention, there is provided a method of forming a thyrister device having a pnpn structure, comprising forming at least part of a vertical SiGe base pnp transistor and a vertical SiGe base npn transistor on top of one another in a complementary BJT process. It will be appreciated that we are not actually stacking bipolar transistors on top on one another but are making use of some of the layers formed in a complementary, bipolar, SiGe base process to provide the pnpn configuration of a thyristor. In particular we are providing for a blocking junction between a p-type and an n-type SiGe base. In one embodiment at least part of the pnp transistor layers is formed on top of part of the npn transistor layers. In another embodiment, part of the npn transistor layers are formed on top of the pnp transistor layers. Preferably the forming of at least part of the npn and pnp transistor layers includes forming both SiGe bases. The method may include using the n-collector and p-base of the npn transistor, and the p-emitter and n-base of the pnp transistor to define a pnpn structure.

Further, according to the invention, there is provided a method of forming an ESD protection structure having a pnpn configuration, comprising forming at least part of a vertical SiGe base pnp transistor and at least part of a vertical SiGe base npn transistor on top of one another as part of a complementary BJT process. Preferably both SiGe bases are used as part of the pnpn structure. The method may include using the n-collector and p-base of the npn transistor, and the p-emitter and n-base of the pnp transistor to define the pnpn structure. The method may further include connecting the collector and base of the npn transistor together to define a cathode, and connecting the emitter and base of the pnp transistor together to define an anode. Preferably the blocking junction of the ESD protection structure is defined by the p-base formed as part of the npn transistor and the n-base formed as part of the pnp transistor. The p-collector of the pnp transistor portion may be overcome by drawing an n-sinker region under the p-base of the npn transistor portion, if the npn layers are at the bottom of the structure. Instead, the p-collector may be blocked using a mask. In the case where the layers of the pnp structure are on the bottom, the n-collector of the npn portion may be overcome by drawing a p-sinker region under the n-base of the pnp transistor structure. Instead, the n-collector of the npn transistor portion may be blocked using a mask.

DETAILED DESCRIPTION OF THE INVENTION

Figure 1:
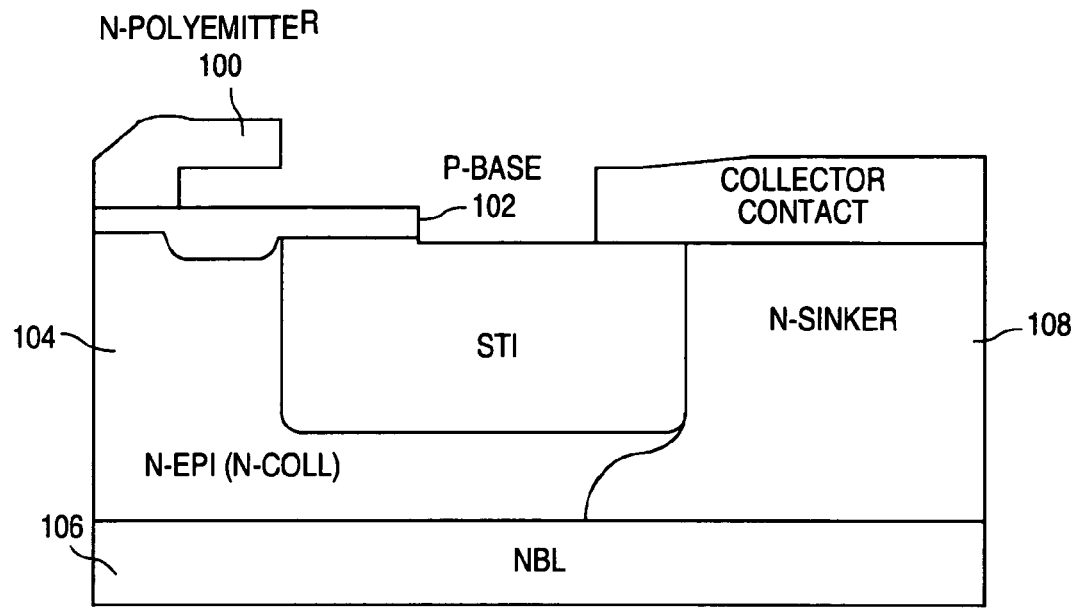
FIG. 1 shows a cross section through a prior art vertical npn bipolar transistor.
Figure 2:
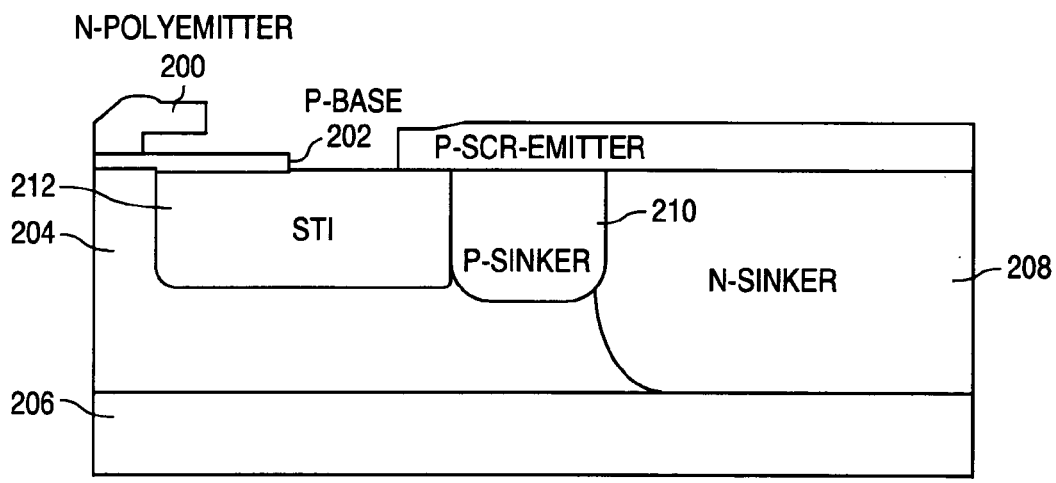
FIG. 2 shows a cross section through a prior art SCR formed in a bipolar process.
Figure 3:
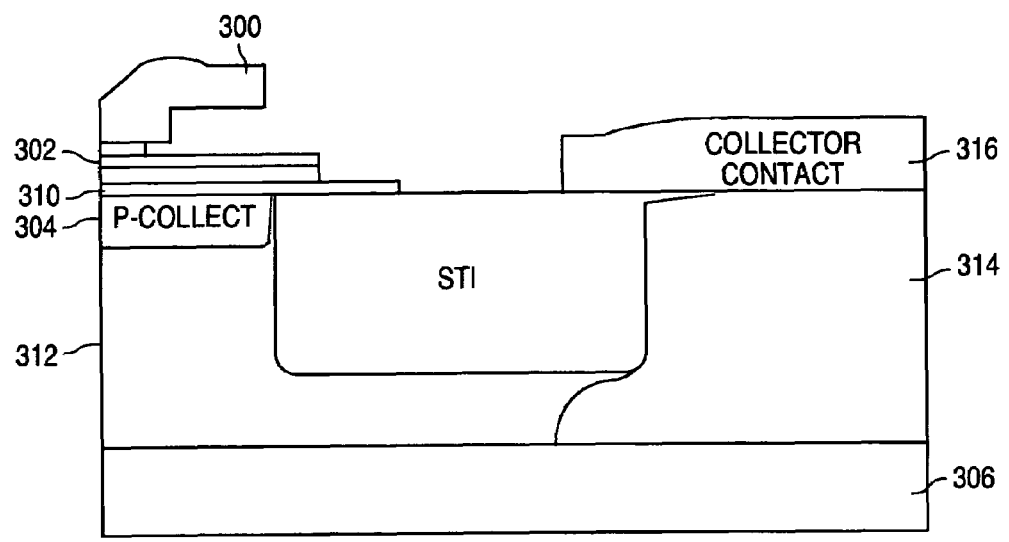
FIG. 3 shows one embodiment of a pnpn thyristor structure of the invention.

The present invention provides for a pnpn thyristor structure by making use of some of the layers provided in a complementary, SiGe base, bipolar process. For ease of discussion the various p and n layers used will be referred to with reference to their names as they would appear in bipolar structures and the invention will be described in terms of forming part of the bipolar transistors. One embodiment of a pnpn thyristor structure of the invention is shown in FIG. 3. This includes part of a vertical SiGe base pnp bipolar transistor formed on top of part of a vertical SiGe base npn bipolar transistor. In particular, as part of the process steps of forming an npn transistor, only the p-type SiGe base 310 and n-collector are used. The n-collector 312 extends into the subcollector comprising an n-buried layer (NBL) 306 and n-sinker 314 which connects to collector contact 316. The n-emitter of the npn transistor does not form part of the pnpn thyristor structure. The portions of the pnp transistor that are used include the p-polysilicon emitter 300 formed on a n-type SiGe base 302. A p-collector 304 is formed below the base 302. The emitter and base of the pnp transistor and the base and collector of the npn transistor thus form a pnpn structure to define a thyristor. In this structure the blocking junction of the thyristor is formed between the SiGe gates 302, 310.

It will be appreciated that the pnp transistor could instead be formed first with the npn transistor formed on top to define an npnp structure.

For purposes of ESD protection, the poly emitter 300 and base 302 of the pnp are connected together to define an anode. The base 310 and collector 316 are connected together to define the cathode.

Figure 4:
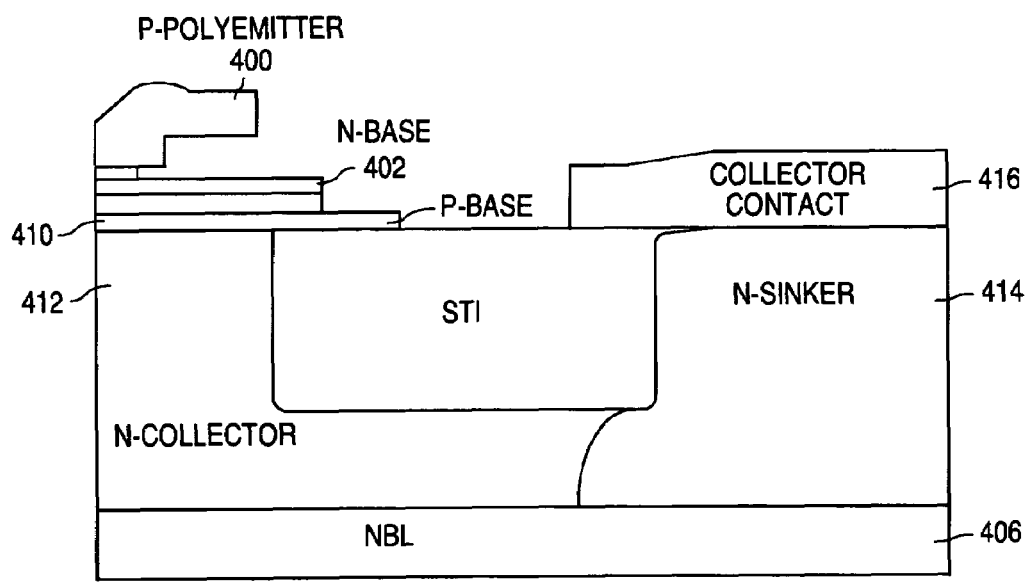
FIG. 4 shows another embodiment of a pnpn thyristor structure of the invention.

Another embodiment of the invention is shown in FIG. 4, which is similar to the embodiment of FIG. 3 but in this embodiment the p-collector of the pnp transistor is blocked by a separate mask. This leaves a p-polysilicon emitter 400 formed on top of a n-type SiGe base 402 of the pnp transistor. A p-type SiGe base 410 and n-subcollector 412 of the npn transistor form the rest of the pnpn structure. The n-subcollector, which takes the form of an NBL 406 and an n-sinker 414, connects the collector 412 to the collector contact 416. The n-emitter of the npn transistor does not form part of the pnpn thyristor structure since the blocking junction of the thyristor is created directly between the two SiGe bases 402, 410.

As in the FIG. 3 embodiment, for ESD protection the poly emitter 400 and base 402 of the pnp are connected together to define an anode. The base 410 and collector contact 416 are connected together to define the cathode.

Figure 5:
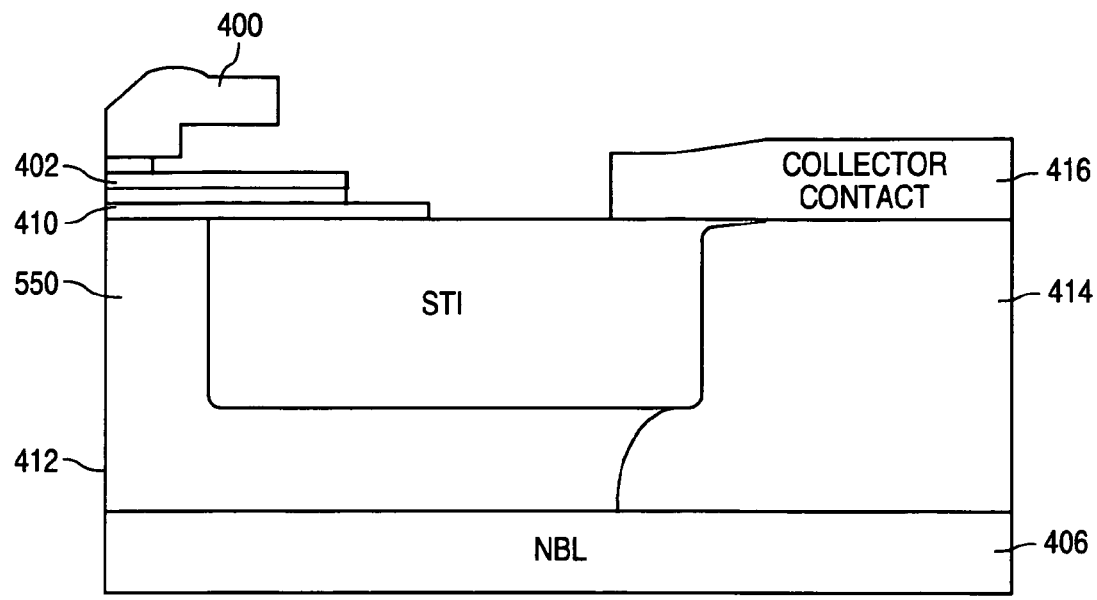
FIG. 5 shows yet another embodiment of a pnpn thyristor structure of the invention.

Yet another embodiment of the invention is shown in FIG. 5. In this embodiment, instead of blocking the p-collector of the pnp transistor, the p-collector is overcome by drawing the n-sinker region 550 under the p-base 410 of the npn transistor. This eliminates the p-collector and leaves a structure that is otherwise structurally similar to the embodiment of FIG. 4. Accordingly the same reference numerals have been used in FIG. 5 to depict the elements that correspond to those in FIG. 4. In particular, a p-polysilicon emitter 400 is formed on top of an n-type SiGe base 402 of the pnp transistor. A p-type SiGe base 410 and n-subcollector 412 of the npn transistor form the rest of the pnpn structure. The n-subcollector, which takes the form of an NBL 406 and an n-sinker 414 connects the collector 412 to the collector contact 416. The n-emitter 420 of the npn transistor does not form part of the pnpn thyristor structure since a blocking junction is created directly between the two SiGe bases 402, 410.

Figure 6:
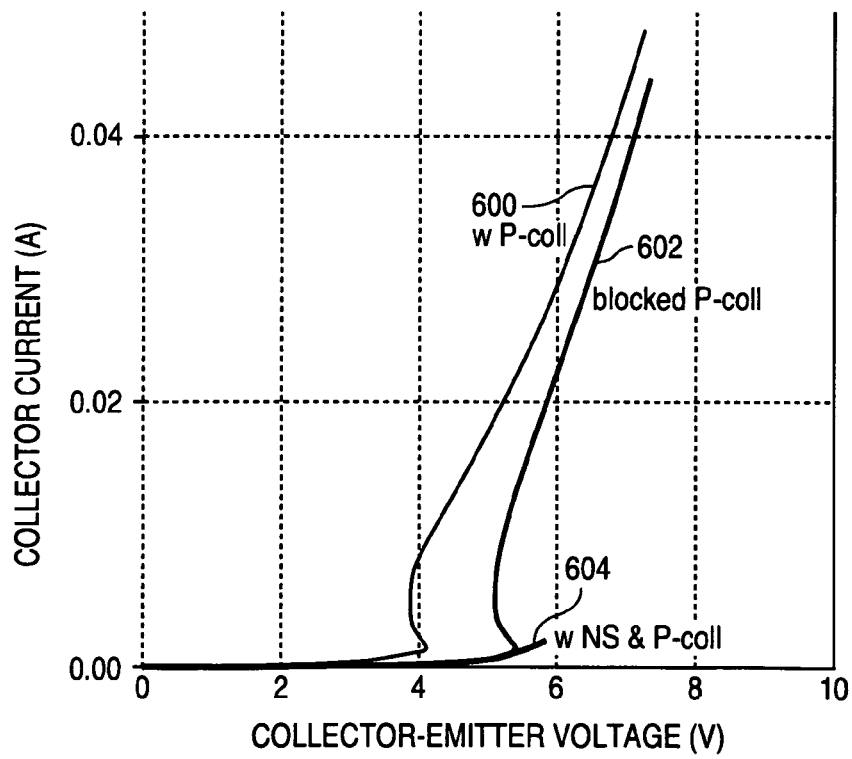
FIG. 6 shows collector current vs. collector-emitter voltage for different embodiments of a pnpn thyristor structure of the invention.

Thus by making use of complementary SiGe bipolar process steps, the present invention permits the making of an ESD device based on a pnpn thyristor structure. FIG. 6 shows collector current versus collector-emitter voltage for a device as shown in FIG. 3 (curve 600), for a device with blocked p-collector as shown in FIG. 4 (curve 602), and for a device with n-sinker supplanting the p-collector as shown in FIG. 5 (curve 604).

While specific embodiments were discussed above, it will be appreciated that the invention could be implemented in different ways without departing from the scope of the invention as defined by the claims.

What is claimed is:

1. A method of forming a thyrister device having a pnpn structure, comprising forming at least part of a vertical SiGe base pnp transistor and at least part of a vertical SiGe base npn transistor on top of one another as part of a complementary BJT process.

2. A method of claim 1, wherein the layers of part of the pnp transistor are formed on top of the layers of part of the npn transistor.

3. A method of claim 1, wherein the layers of part of the npn transistor are formed on top of the layers of part of the pnp transistor.

4. A method of claim 1, wherein the forming of at least part of the npn and pnp transistors includes forming both SiGe bases.

5. A method of claim 4, further comprising using the n-collector and p-base of the npn transistor, and the p-emitter and n-base of the pnp transistor to define a pnpn structure.

6. A method of claim 4, further comprising using the p-collector and n-base of the pnp transistor, and the n-emitter and p-base of the npn transistor to define a pnpn structure.

7. A method of forming an ESD protection structure having a pnpn configuration, comprising forming at least some of the layers of a vertical SiGe base pnp transistor and at least some of the layers of a vertical SiGe base npn transistor on top of one another in a complementary BJT process.

8. A method of claim 7, wherein both SiGe bases are used as part of the pnpn structure.

9. A method of claim 8, comprising using the n-collector and p-base of the npn transistor layers, and the p-emitter and n-base of the pnp transistor layers to define the pnpn structure.

10. A method of claim 9, further comprising connecting the collector and base of the npn transistor together to define a cathode, and connecting the emitter and base of the pnp transistor together to define an anode.

11. A method of claim 8, comprising using the p-collector and n-base of the pnp transistor layers, and the n-emitter and p-base of the npn transistor layers to define the pnpn structure.

12. A method of claim 11, further comprising connecting the collector and base of the pnp transistor together to define an anode, and connecting the emitter and base of the npn transistor together to define a cathode.

13. A method of claim 9, wherein the blocking junction is defined by the p-base of the npn transistor and the n-base of the pnp transistor.

14. A method of claim 11, wherein the blocking junction is defined by the p-base of the npn transistor and the n-base of the pnp transistor.

15. A method of claim 9, wherein the p-collector is overcome by drawing an n-sinker region under the p-base of the npn transistor.

16. A method of claim 9, wherein the p-collector is blocked using a mask.

17. A method of claim 11, wherein the n-collector is overcome by drawing a p-sinker region under the n-base of the pnp transistor.

18. A method of claim 11, wherein the p-collector is blocked using a mask.

* * * * *